(12) United States Patent
Honda et al.

(10) Patent No.: US 7,947,537 B2
(45) Date of Patent: May 24, 2011

(54) METAL OXIDE SEMICONDUCTOR, SEMICONDUCTOR ELEMENT, THIN FILM TRANSISTOR AND METHOD OF MANUFACTURING THEREOF

(75) Inventors: Makoto Honda, Tokyo (JP); Katsura Hirai, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 198 days.

(21) Appl. No.: 12/341,387

(22) Filed: Dec. 22, 2008

(65) Prior Publication Data

US 2009/0173938 A1 Jul. 9, 2009

(30) Foreign Application Priority Data

Dec. 26, 2007 (JP) .................................. 2007-333893
Jul. 25, 2008 (JP) .................................. 2008-192037

(51) Int. Cl.
*H01L 21/335* (2006.01)
*H01L 29/10* (2006.01)

(52) U.S. Cl. ................................ 438/142; 257/E21.459
(58) Field of Classification Search .................... 257/43, 257/E29.068, E21.459, 40, E21.09, E21.029; 438/104, 149, 48, 99, 142
See application file for complete search history.

(56) References Cited

U.S. PATENT DOCUMENTS 5,364,522 A * 11/1994 Wang .............................. 205/50

FOREIGN PATENT DOCUMENTS

JP 2001-244464 * 9/2001

* cited by examiner

*Primary Examiner* — Thomas L Dickey
*Assistant Examiner* — Nikolay Yushin
(74) *Attorney, Agent, or Firm* — Lucas & Mercanti, LLP

(57) ABSTRACT

A method of manufacturing a metal oxide semiconductor comprising the step of: conducting a transformation treatment on a semiconductor precursor layer containing a metal salt to form the metal oxide semiconductor, wherein the metal salt comprises one or more metal salts selected from the group consisting of a nitrate, a sulfate, a phosphate, a carbonate, an acetate and an oxalate of a metal; and the semiconductor precursor layer is formed by coating a solution of the metal salt.

11 Claims, 5 Drawing Sheets

FIG. 3 (1)
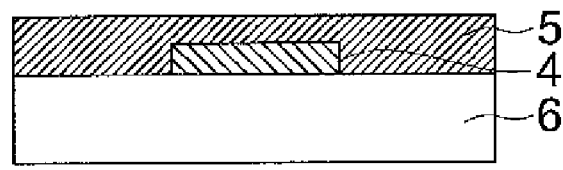
FIG. 3 (2)
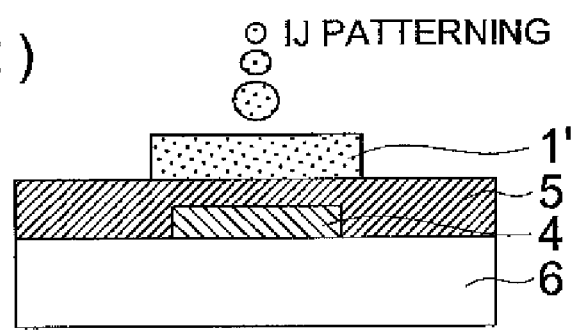
FIG. 3 (3)
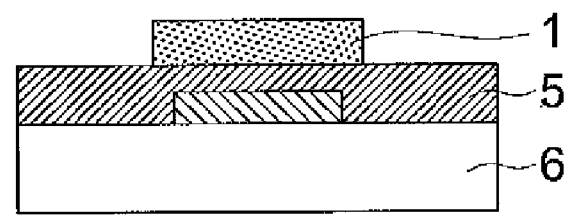
FIG. 3 (4)
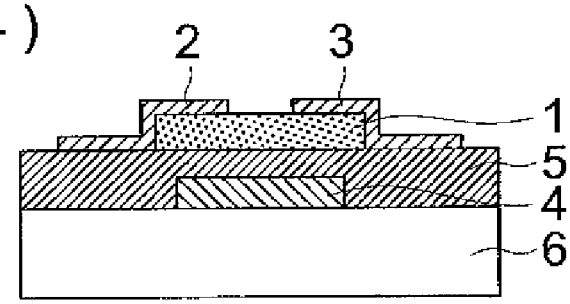

FIG. 4 (1)
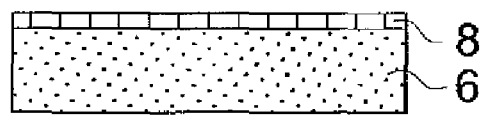
FIG. 4 (2)
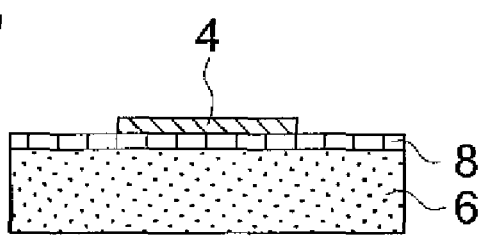
FIG. 4 (3)
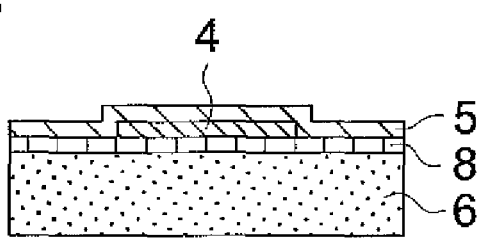
FIG. 4 (4)
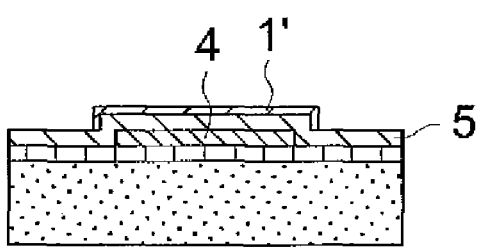
FIG. 4 (5)
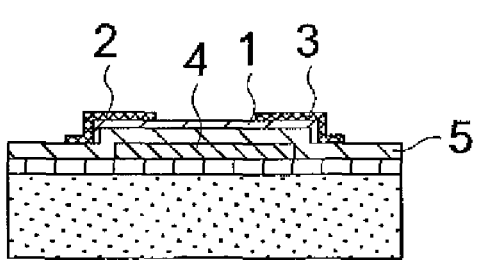

METAL OXIDE SEMICONDUCTOR, SEMICONDUCTOR ELEMENT, THIN FILM TRANSISTOR AND METHOD OF MANUFACTURING THEREOF

FIELD OF THE INVENTION

The present invention relates to a method of manufacturing a metal oxide semiconductor, and, specifically, to a method of manufacturing a metal oxide semiconductor via a coating method, in which a metal salt which is coatable as a solution is used as a precursor, which is then subjected to a transformation treatment to a semiconductor.

BACKGROUND OF THE INVENTION

A method to obtain a metal oxide semiconductor via decomposition oxidation (heat decomposition reaction) of a metal salt or an organic metal has been known.

As a technology to carry out decomposition oxidation (heat decomposition reaction) on an organic metal to obtain an oxide semiconductor, for example, the methods disclosed in Patent Documents 1 and 2 are known.

In these methods, thermal oxidation or plasma oxidation is usually used for the oxidation of a precursor. However, when a thermal oxidation method is used to oxidize a precursor, a very high temperature range of at least 400° C. or more, substantially, 550° C. or more is usually needed to obtain a desired property. Accordingly, the energy efficiency is not high, a relatively long processing time is needed, and the application of a light and flexible resin substrate becomes difficult because the temperature of the substrate increases as high as the treatment temperature while being treated.

In the case of plasma oxidation, since the treatment is carried out in an extremely reactive plasma space, there has been a problem that the electrode or the insulating layer is degraded in the thin film transistor manufacturing process, whereby the mobility and the off electric current (dark current) turns worse.

Also, a method to obtain a metal oxide semiconductor via such as a thermal oxidation using an organic metal or a metal salt as a precursor has been known (for example, refer to Non-Patent Document 1, 2, or 3) For example, when a metal alkoxide is used as a precursor, there may be a problem that the property may deteriorate due to remaining carbon, as well as a problem that a high temperature treatment is needed, or, when a chloride is used as a precursor, there may be a problem that halogen is evacuated. These precursors also have a problem that the precursors may be hydrolyzed by the water contained in the atmosphere, and, further, these precursors need a big amount of organic solvents, which is not preferred in view of the circumstance problem. Moreover, there have been problems that the thin film transistor (TFT) produced by using these metal oxide semiconductors exhibits a lower mobility, a smaller on/off ratio and a larger threshold value.

On the other hand, examples of manufacturing a thin film transistor by forming a metal oxide semiconductor film via a sputtering method are disclosed in Patent Documents 3 and 4. There may be a problem in the method using a vacuum apparatus such as sputtering that the manufacturing efficiency is not high, because a batch production is needed in such a method. Also, there has been a problem that the metal oxide semiconductor manufactured by using a sputtering method tends to have a property variation, and that a high temperature treatment after the production is needed to stabilize the property.

Patent Document 1: Japanese Patent Application Publication Open to Public Inspection (hereafter referred to as JP-A) No. 2003-179242
Patent Document 2: JP-A No. 2005-223231
Patent Document 3: JP-A No. 2006-165527
Non-Patent Document 1: "Kagaku-Kogyo", 2006, December, "Synthesis of Oxide-Semiconductor Thin Film by Sol-Gel Method, and Its Application"
Non-Patent Document 2: Electrochemical and Solid-State Letters, 10(5) H135-H138
Non-Patent Document 3: Advanced Materials 2007, 19, 183-187
Non-Patent Document 4: IDW' 07 (International Display Workshop 2007) p1783

SUMMARY OF THE INVENTION

An object of the present invention is to provide a method of manufacturing a metal oxide semiconductor layer by carrying out a transformation treatment to a semiconductor with a high manufacturing efficiency, in which film formation can be carried out via a coating process (for example, a printing method or an inkjet method) under an atmospheric pressure using a metal salt as a precursor, and, further, a low temperature manufacturing is possible, and to provide a TFT element obtained by using the method.

One of the aspects of the present invention to achieve the above object is a method of manufacturing a metal oxide semiconductor comprising the step of: conducting a transformation treatment on a semiconductor precursor layer containing a metal salt to form the metal oxide semiconductor, wherein the metal salt comprises one or more metal salts selected from the group consisting of a nitrate, a sulfate, a phosphate, a carbonate, an acetate and an oxalate of a metal; and the semiconductor precursor layer is formed by coating a solution of the metal salt.

BRIEF DESCRIPTION OF THE DRAWINGS

FIGS. 3(1)-3(4) are drawings illustrating the manufacturing process of Example 1 as schematic cross-sectional views.

FIGS. 4(1)-4(5) are drawings illustrating the manufacturing process of Example 2 as schematic cross-sectional views.

DESCRIPTION OF THE PREFERRED EMBODIMENTS

Figure 1:
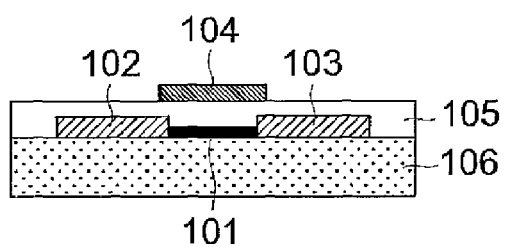
FIGS. 1(a)-1(f) are drawings illustrating typical constitutions of thin film transistors.
Figure 1:
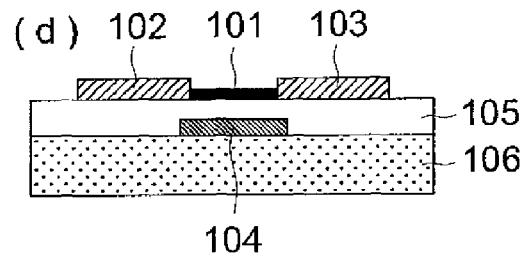
Figure 1:
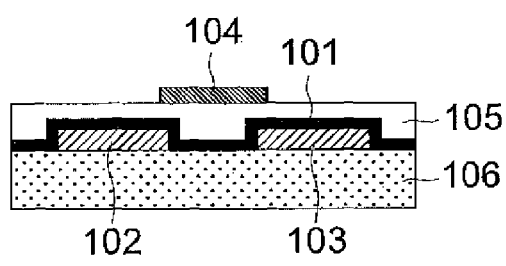
Figure 1:
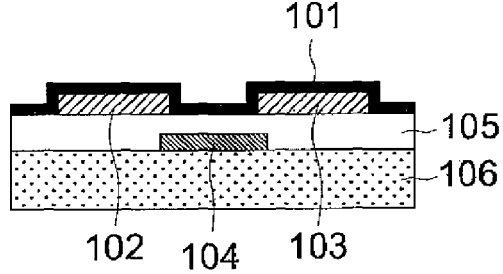
Figure 1:
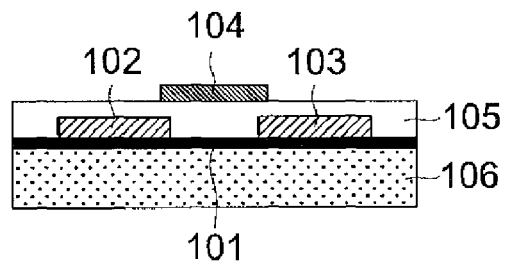
Figure 1:
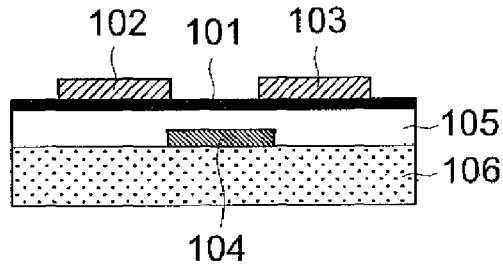

The above object of the present invention is achieved by the following structures.

1. A method of manufacturing a metal oxide semiconductor comprising the step of:
conducting a transformation treatment on a semiconductor precursor layer containing a metal salt to form the metal oxide semiconductor,
wherein
the metal salt comprises one or more metal salts selected from the group consisting of a nitrate, a sulfate, a phosphate, a carbonate, an acetate and an oxalate of a metal; and
the semiconductor precursor layer is formed by coating a solution of the metal salt.

2. The method of Item 1, wherein the solution of the metal salt is an aqueous solution.

3. The method of Item 1 or 2, wherein the metal salt comprises at least one selected from the group consisting of metal salts of In, Zn and Sn.

4. The method of any one of Items 1 to 3, wherein the metal salt comprises at least one selected from the group consisting of metal salts of Ca and Al.

5. The method of any one of Items 1 to 4, wherein the metal salt is a nitrate.

6. The method of any one of Items 1 to 5,
wherein
the solution of the metal salt comprises a metal salt of Metal A, a metal salt of Metal B and a metal salt of Metal C in a molar ratio of Metal A, Metal B and Metal C represented by the following formula:

Metal A:Metal B:Metal C=1:0.2-1.5:0-5, wherein
Metal A denotes a metal contained in a metal salt selected from the group consisting of metal salts of In and Sn;
Metal B denotes a metal contained in a metal salt selected from the group consisting of metal salts of Ga and Al; and
Metal C denotes a metal contained in a metal salt of Zn.

7. The method of any one of Items 1 to 6, wherein the transformation treatment is a heat treatment at a temperature of 100° C. to 400° C.

8. The method of any one of Items 1 to 6, wherein the transformation treatment comprises microwave irradiation, wherein a frequency of the microwave is 0.3 GHz to 50 GHz.

9. A metal oxide semiconductor manufactured by the method of any one of Items 1 to 8.

10. A semiconductor element employing the metal oxide semiconductor of Item 9.

11. A thin film transistor employing the metal oxide semiconductor of Item 9.

According to the present invention, a method of manufacturing a metal oxide semiconductor with a high manufacturing efficiency, in which manufacturing of a metal oxide semiconductor layer can be carried out via an aqueous coating process, and at a lower temperature than before, can be obtained, and also a TFT element can be obtained. The aqueous coating method being preferable in view of the circumstance problem.

The best mode to carry out the present invention will be explained below, however, the present invention is not limited thereto.

The present invention is characterized in that a method of manufacturing a metal oxide semiconductor is provided, in which a transformation treatment to a semiconductor is carried out on a semiconductor precursor layer containing a metal salt, wherein the metal salt includes one or more metal salt selected from: a nitrate, a sulfate, a phosphate, a carbonate, an acetate or an oxalate of a metal; and the semiconductor precursor layer is formed by coating a solution of a metal salt.

In the present invention, the semiconductor is a metal oxide, and a thin film of a semiconductor thin film is obtained by forming a thin film of a metal salt containing a metal component of a metal oxide being used as a precursor of the metal oxide semiconductor, followed by transforming the precursor to a metal oxide semiconductor.

It is well known that a metal oxide semiconductor is obtained by thermally oxidizing the precursor of a metal oxide semiconductor. As examples of a metal compound applicable as the precursor of a metal oxide semiconductor, a very wide range of inorganic metal salts or organic metal compounds, as well as organic metal complexes are known. Specifically, organic metal compounds or metal salts are known, which are used also in above Non-Patent Documents 2 and 3.

In the present invention, a metal salt selected from a nitrate, a sulfate, a phosphate, a carbonate, an acetate, or an oxalate is used as the precursor of a metal oxide semiconductor.

Examples of a metal in the metal salt include: Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb and Lu.

In the present invention, it is preferable that the metal salt contains a metal salt of at least one selected from indium (In), tin (Sn) or zinc (Zn). These metal salts may be mixed to be used in combination.

Further, as other metal, a salt of either of gallium (Ga) or aluminum (Al) is preferably used.

In the present invention, a metal oxide semiconductor exhibiting excellent properties, namely, a larger mobility, and a larger on/off ratio when used as a TFT element, can be obtained by using the metal salt selected from a nitrate, a sulfate, a phosphate, a carbonate, an acetate or an oxalate of the abovementioned metal.

When compared with the cases in which other metal salts or organic metal compounds are used, these metal salts are assumed to exhibit more preferable semiconductor performance since the energy change of oxidation is smaller, in which hydrolysis or dehydration is expected to be included, and the decomposition products formed in the oxidation process is effectively removed by evaporation and tends not to remain in the layer, whereby the amount of impurity component such as carbon remaining in the formed oxide is smaller.

Among the above metal salts, a nitrate is most preferable in view of reducing the impurity and improving the semiconductor performance.

The effect of the improvement in a semiconductor performance obtained with a metal salt, specifically, a nitrate, is most notable in the formation process of an amorphous metal oxide semiconductor carried in the temperature range of 100° C. or more and 400° C. or less. It has not been known that an excellent performance of an amorphous oxide semiconductor can be obtained in a semiconductor thin film formed by using a metal salt as a raw material. This is one of the notable effects of the present invention.

It is preferable to use these salts because, when the transformation treatment to a semiconductor is carried out by using an electromagnetic wave (microwave) at substantially a low temperature, the duration of the irradiation can be shortened.

(Film Forming Method of Semiconductor Precursor Thin Film, Patterning Method)

In order to form the thin film containing a metal salt used as the precursor of these metal oxide semiconductors, for example, a well-known film forming method, a vacuum evaporation method, molecular beam epitaxy, an ion cluster beam method, a low energy ion beam method, an ion-plating method, CVD, a sputtering method and an atmospheric-pressure plasma method can be used, however, in the present invention, it is preferable that a solution of a metal salt selected from a nitrate, a sulfate, a phosphate, a carbonate, an acetate or an oxalate, dissolved in an appropriate solvent, is coated on a substrate, whereby the productivity is notably improved.

The solvent including water is not specifically limited as far as it can dissolve a metal salt compound to be used. Examples of a solvent preferably used in the present invention include: water; alcohols such as ethanol, propanol and ethylene glycol; ethers such as tetrahydrofuran and dioxane; esters such as methyl acetate and ethyl acetate; ketones such as acetone, methylethyl ketone and cyclohexanone; glycohol ethers such as diethylene glycol monomethyl ether; acetonitrile; aromatic hydrocarbons such as xylene and toluene; such as hexane, cyclohexane and tridecane; α-terpineol; halogenated alkyl solvents such as chloroform and 1,2-dichloroethane, N-methylpyrolidone; and carbon sulfide.

In the present invention, the solvent used for a metal salt solution is not specifically limited as far as it can dissolve the metal salt, however, water and a lower alcohol are preferable in view of the solubility of the metal salt and the drying characteristic after coating. Among the lower alcohols, methanol, ethanol and propanol (1-propanol and isopropanol) are preferable in view of the drying characteristics. The alcohol may be used alone or may be used as a mixture with water in an arbitrary ratio. In view of the solubility and the solution stability, it is preferable to prepare an aqueous solution of the present invention by mixing water and these lower alcohols. It is preferable to prepare an aqueous solution by mixing water and a lower alcohol because the surface tension can be lowered without drastically changing the composition, whereby ejecting property of an inkjet ink is improved.

Further, as an effect of the addition of the alcohols, the improvement in the semiconductor performance can be observed. For, example, improvement in a mobility, on/off ratio or threshold value in the thin film transistor can be observed. The reason for this effect is not fully clear, but it is assumed that the formation process of the oxide via heating is concerned.

In view of the drying characteristics, inkjet ejecting property, transistor characteristics such as a transistor performance, a lower alcohol is preferably added in an amount of 5% by mass or more, and to satisfy either properties (drying characteristic, ejecting property and solution stability), the ratio of water/lower alcohol is preferably 5/5-95/5.

In the present invention, an aqueous solution means the solution in which a solute (in the present invention, such as a metal salt and an additive if necessary) is dissolved in a mixed solvent having a water content of 30% by mass or more based on the mass of the solvent or in water (the water content is 100% by mass). In view of the solubility of a solute such as a metal salt and the solution stability, the water content is preferably 50% by mass or more, and more preferably 70% by mass or more.

Since the metal salt relating to the present invention such as the above nitrate is not hydrolyzed at room temperature unlike a metal alkoxide, water can be used as a main solvent, which is preferable in view of the manufacturing process and environmental reason.

For example, although a metal salt such as a metal chloride shows strong tendency to cause deterioration due to air, decomposition (specifically, in the cases of such as gallium) and deliquescence, the inorganic salt relating to the present invention such as a nitrate does not show deliquescence or deterioration due to air and is easy to treat, which is preferable in view of the manufacturing environment.

Also among the metal salts relating to the present invention, most preferable is a nitrate which exhibits excellent properties with respect to deterioration, decomposition, solubility and deliquescence against water.

In the present invention, a solution containing a metal salt is applied on a substrate to form a thin film containing the precursor of a metal oxide semiconductor.

Examples of a method to form a thin film containing the precursor of a metal oxide semiconductor by applying a solution containing a metal salt on a substrate include: a coating method in a broad sense, for example, coating methods such as a spray coat method, a spin coat method, a blade coat method, a dip coat method, a cast method, a roll coat method, a bar coat method, a die coat method and a mist coat method; and printing methods such as a letterpress method, an intaglio printing method, a planographic printing method, a screen printing method and an inkjet method, and a method of patterning using thereof. Alternatively, patterning may be conducted by photolithography or laser abrasion using the coated film. Of these, an inkjet method and a spray coat method are preferable, by which thin film coating is possible.

When forming a film via an inkjet method, a thin film of a precursor of a metal oxide containing a metal salt is formed by evaporating the solvent (water) at 80° C.-about 150° C. after the metal salt solution is dropped. When a solution is dropped on the substrate, the substrate itself is preferably heated at 80° C.-about 150° C., whereby the two processes of application and desiccation can be simultaneously carried out. This method is also preferable since the film forming property of the precursor film is excellent.

(Metal Composition Ratio)

A thin film of the metal oxide semiconductor containing one of or a plurality of metal atoms selected from the above-mentioned metal atoms is formed according to the method of the present invention. As a metal oxide semiconductor, any state of a single crystal, a polycrystal, and an amorphous are applicable, however, an amorphous thin film is preferably used.

As for the metal atom contained in the formed metal oxide semiconductor, it is preferable that at least one of indium (In), tin (Sn) and zinc (Zn) is included, similarly as described before, and it is also preferable that a gallium (Ga) or an aluminum (aluminum) is further included.

When producing a precursor solution which contains these metals as a component, the molar ratio of (Metal A:Metal B:Metal C) preferably satisfies the following formula, provided that, (Metal A) denotes the metal contained in the metal salt selected from the metal salts of In and Sn; (Metal B) denotes the metal contained in the metal salt selected from the metal salts of Ga and Al; and (Metal C) denotes the metal contained in the metal salt of Zn.

Metal A:Metal B:Metal C=1:0.2-1.5:0-5

Since the nitrate is the most preferable as a metal salt, it is preferable that a nitrate of each metal is dissolved in a solvent containing water as a main component to form a coating liquid so that the molar ratio (A:B:C) of In, Sn (metal A), Ga and Al (metal B) and Zn (metal C) satisfies the above formula, followed by forming a precursor thin film containing the inorganic metal salts using the coating liquid.

The thickness of the thin film containing the metal salt used as a precursor is 1-200 nm and more preferably 5-100 nm.

(Amorphous Oxide)

As the state of formed metal oxide semiconductor, any of a single crystal, a polycrystal, and an amorphous is applicable, however, preferable is an amorphous thin film. The state of amorphous can be confirmed by X-ray diffraction or electron diffraction. When no diffraction pattern specific for a crystal is observed, it can be estimated as amorphous.

As the electronic carrier concentration of the amorphous oxide which is a metal oxide concerning the present invention formed from the metal compound used as a metal oxide semiconductor precursor, acceptable electronic carrier concentration is less than $10^{18}/cm^3$. The electronic carrier concentration denotes a value measured at room temperature The room temperature is, for example, 25° C., and specifically a value arbitrarily selected from 0° C.-about 40° C. the electronic carrier concentration of the amorphous oxide concerning the present invention does not need to satisfy less than $10^{18}/cm^3$ in all the range of 0 to 40° C., and desirable is that less than $10^{18}/cm^3$ is satisfied at 25° C. When the electronic carrier concentration is lowered further to less than $10^{17}/cm^3$, and more preferably less than $10^{16}/cm^3$, TFTs exhibiting normally-off can be manufactured with an excellent yield.

The concentration of an electronic carrier concentration can be determined by a Hall effect measurement.

The thickness of the semiconductor containing a metal oxide is not specifically limited. However, the performance of a transistor tends to be influenced by the thickness of the semiconductor layer, and the thickness is, although depending to the semiconductor, generally 1 μm or less and preferably 10-300 nm.

In the present invention, by controlling, for example, the precursor material, composition ratio, manufacturing condition, the electronic carrier concentration is controlled to be preferably $10^{12}/cm^3$ or more but less than $10^{18}/cm^3$, more preferably $10^{13}/cm^3$-$10^{17}/cm^3$ and, further more preferably $10^{15}/cm^3$-$10^{16}/cm^3$.

As a method of transformation, namely, a method to transform the precursor thin film formed using the inorganic metal salt to a metal oxide semiconductor, for example, an oxygen plasma method, a thermal oxidation method and a UV ozone method are cited. Further, the microwave irradiation which will be mentioned later can be used.

In the present invention, the temperature to heat the precursor material can be arbitrarily selected in the range of 50° C.-1000° C. of the surface temperature of a thin film containing a precursor. The temperature is preferably 100° C.-400° C. in view of the performance of the device and the productivity. The surface temperature of a thin film or the temperature of a substrate can be measured by, for example, a surface thermometer having a thermocouple, a radiation thermometer which can measure a radiation temperature and a fiber thermometer. The heating temperature can be controlled by the output power of the electromagnetic wave, the duration of irradiation and the number of times of irradiation. The heating duration of the precursor material can be arbitrary selected, however, the heating duration is preferably 1 second to 60 minutes in view of the performance of the device and the productivity. The heating duration is more preferably 5 minutes to 30 minutes.

The transformation treatment to the semiconductor can be carried out at a relatively low temperature by using the metal salt selected from a nitrate, a sulfate, a phosphate, a carbonate, an acetate or an oxalate of the present invention.

Formation of a metal oxide can be detected by, for example, ESCA and the condition under which the transformation to a semiconductor is fully carried out can be selected beforehand.

It is preferable to use the atmospheric pressure plasma method as an oxygen plasma method. In an oxygen plasma method and an UV ozone method, the substrate is preferably heated at 50° C.-300° C.

When an atmospheric pressure plasma method is used, an inert gas such as argon as a discharge gas and a reactive gas (the reactive gas containing oxygen) are introduced into a discharge space under an atmospheric pressure; a high frequency electric field is applied to excite the discharge gas, whereby plasma is generated; the reactive gas is contacted with the plasma to generate oxygen plasma; and the substrate surface is exposed to the oxygen plasma, whereby the semiconductor precursor material is oxidized. The atmospheric pressure represents a pressure of 20-110 kPa and preferably a pressure of 93-104 kPa.

Using the atmospheric pressure plasma method, oxygen plasma is generated by using an oxygen containing gas as a reactive gas, and a precursor thin film containing a metal salt is exposed to a plasma space to form a layer constitute of a metal oxide via the oxidizing decomposition of the precursor thin film.

As a high frequency power source, the frequency is 0.5 kHz or more and 2.45 GHz or less, and the electric power provided between the opposing electrodes are preferably 0.1 w/cm$^2$ or more and 50 W/cm$^2$ or less.

The gas to be used is fundamentally a mixed gas of a discharge gas (inert gas) and a reactive gas (an oxidative gas) The reactive gas is preferably an oxygen gas and is preferably contained in the amount of 0.01-10% by volume, more preferably 0.1-10% by volume and further more preferably 0.1-5% by volume, based on the volume of the mixed gas.

As the abovementioned inert gas, cited are Group 18 elements of the periodic table, specifically, helium, neon, argon, krypton, xenon, and radon, as well as nitrogen. Of these, helium, argon and nitrogen are preferably used in order to obtain the effect of the present invention.

The reactive gas may be introduced between the electrodes being a discharge space at an ambient temperature under an atmospheric pressure.

The atmospheric pressure plasma method is disclosed in, for example, JP-A Nos. 11-61406, 11-133205, 2000-121804, 2000-147209 and 2000-185362.

A UV ozone method denotes a method in which a substance is irradiated with an ultraviolet light under existence of oxygen to promote an oxidation reaction. As for the wavelength of the ultraviolet light, it is preferable to use a so-called vacuum ultraviolet light irradiation having wavelengths of preferably 100 nm-450 nm and more preferably 150-300 nm. As the light source, applicable are a low-pressure mercury lamp, a deuterium lamp, a xenon excimer lamp, a metal halide lamp, an excimer laser lamp.

The output power of the lamp is preferably 400 W-30 kW, the illuminance is preferably 100 mw/cm$^2$-100 kW/cm$^2$, and the irradiation energy is preferably 10-5000 mJ/cm$^2$ and more preferably 100-2000 mJ/cm$^2$.

The illuminance of UV irradiation is preferably 1 mW-10 W/cm$^2$.

In the present invention, in addition to the oxidation treatment, it is preferable to conduct a heat-treatment after the abovementioned oxidation treatment or simultaneously with the abovementioned oxidation treatment, whereby the oxidative decomposition can be promoted.

After oxidizing the thin film containing a metal salt, the substrate is preferably heated to 50° C.-200° C., more preferably 80° C.-150° C., and, as a heating duration, for 1 minute to 10 hours.

The heat-treatment may be performed simultaneously with the oxidation treatment, whereby the transformation to a metal oxide via oxidation can be promptly carried out.

The thickness of the semiconductor thin film formed after the transformation to a metal oxide semiconductor is preferably 1-200 nm and more preferably 5-100 nm.

In the present invention, it is preferable to include a process of microwave irradiation (0.3 GHz-50 GHz) in the abovementioned transformation process to a semiconductor. It is also preferable to carry out microwave irradiation under existence of oxygen to promote the oxidation reaction of the metal oxide semiconductor precursor in a short time.

(Microwave Irradiation)

In the present invention, it is preferable to use microwave irradiation as a method to transform the thin film formed of the abovementioned inorganic metal salt material used as the precursor of a metal oxide semiconductor into a semiconductor.

That is, after forming the thin film containing the abovementioned metal salt material used as the precursor of these metal oxide semiconductors, the thin film is irradiated with an electromagnetic wave, specifically, with a microwave (frequency of 0.3 GHz-50 GHz).

When the thin film containing the abovementioned metal salt material used as the precursor of a metal oxide semiconductor is irradiated with a microwave, the electron in the metal oxide precursor vibrates and heat is generated. By the heat the thin film is uniformly heated from inside. In the case of a substrate formed with such as glass or resin, since there is almost no absorption in the microwave range, the substrate itself is hardly heated and only the thin film portion is selectively heated, whereby thermal oxidation and transformation to a metal oxide semiconductor are conducted.

As is general for a microwave heating, absorption of the microwave is concentrated on a material having a strong absorption power and it is possible to increase the temperature in a very short time. When the technique is applied to the present invention, the substrate is hardly affected by the heat generated by the electromagnetic wave while only the temperature of the precursor thin film can be raised to a temperature at which the oxidation reaction can be conducted, whereby the metal oxide precursor can be transformed to a metal oxide. Further, the temperature and heating duration can be controlled by the power and irradiation time of the microwave and it is possible to adjust them according to the substrate material.

Generally a microwave refers to an electromagnetic wave within the frequency range of 0.3 GHz-50 GHz. All of the following electromagnetic waves: 0.8 GHz and 1.5 GHz bands for mobile-phone communication, 2 Hz band for ham radio, 1.2 GHz band for aircraft radar, 2.4 GHz band for, for example, microwave oven, premises wireless and VICS, 3 Hz band for marine vessel radar and 5.6 GHz band for ETC are included in the category of a microwave. Oscillators providing such as 28 GHz and 50 GHz are commercially available.

When compared with the usual heating method using, for example, an oven, a more preferable metal oxide semiconductor layer can be obtained by using the heating method employing electromagnetic wave (microwave) irradiation of the present invention. In the process of transforming a metal oxide semiconductor precursor material into a metal oxide semiconductor, a function other than the thermal-conduction, for example, an effect suggesting a direct action of the electromagnetic waves to metal oxide semiconductor precursor material has been obtained. Although the mechanism is not fully cleat, it is assumed that the conversion of the metal oxide semiconductor precursor material to the metal oxide semiconductor via hydrolysis, dehydration, decomposition or oxidation has been promoted by the electromagnetic wave.

The method to irradiate the semiconductor precursor layer containing the metal salt with a microwave to carry out transformation to a semiconductor is a method by which the oxidation reaction is selectively conducted in a short time. In order to promote the oxidation reaction of the metal oxide semiconductor precursor in a short time, the microwave irradiation is preferably carried out under existence of oxygen, wherein, since not a small amount of heat may be transferred to the substrate due to thermal conduction, it is still more preferable to carry out the treatment so that the temperature of the surface of the thin film containing a precursor is controlled within 100° C.-400° C. by controlling the power, the duration of irradiation and the number of times of irradiation, when a substrate having a low heat-resistance such as a resin substrate is used. The temperature of the thin film surface and the temperature of a substrate can be measured with a surface thermometer having a thermocouple or a non-contact surface thermometer.

Further, when a strong electromagnetic wave absorber such as ITO is provided in the vicinity (for example, a gate electrode), it also absorbs the microwave and generate heat. Accordingly, the vicinity area thereof can be heated in a short time.

The metal oxide semiconductor thin film formed from the metal salt relating to the present invention can be use for various semiconductor devices such as a transistor and a diode, as well as an electronic circuit. By coating the solution of a precursor material on a substrate, production of the metal oxide semiconductor material layer by a low-temperature process becomes possible, and the method can be preferably applied to the production of a semiconductor device such as a thin film transistor element (TFT element) using a resin substrate.

The metal oxide semiconductor of the present invention may also be used for a diode or a photosensor. For example, by laminating the metal oxide semiconductor of the present invention with a metal thin film composed of an electrode material, which will be explained later, a schottky diode or a photodiode may also be manufactured.

(Element Constitution)

FIGS. 1 (*a*)-1 (*f*) illustrate typical constitutions of a thin film transistor element employing the metal oxide semiconductor relating to the present invention.

Examples of the constitution of a thin film transistor element are shown in FIGS. 1 (*a*)-1 (*f*). In the figure, the transistor element is composed so that semiconductor layer 101 containing the metal oxide semiconductor connects source electrode 102 and drain electrode 103 by forming a channel.

In FIG. 1(*a*), a field-effect transistor is formed in such a manner that source electrode 102 and drain electrode 103 are formed on support 106; while employing the resulting support as a substrate, semiconductor layer 101 is formed between the above electrodes; and on the resulting film, gate insulating layer 105 is formed and further on the above, gate electrode 104 is formed. FIG. 1(*b*) shows another field-effect transistor formed in such a manner that semiconductor layer 101, which is formed between the electrodes in FIG. 1(*a*), is formed employing a coating method so that all of the electrodes and the support surface are covered. In FIG. 1(*c*), still another field-effect transistor is formed in such a manner that, initially, semiconductor layer 101 is formed on support 106 and subsequently, source electrode 102, drain electrode 103, insulating layer 105, and gate electrode 104 are formed. In the present invention, the semiconductor layer is formed via the method of the present invention.

In FIG. 1(*d*), after forming gate electrode 104 on support 106, gate insulating layer 105 is formed, and, on the gate insulating layer 105, source electrode 102 and drain electrode 103 are formed. Subsequently, semiconductor layer 101 is formed between the above electrodes. The structures shown in FIGS. 1(*e*) and 1(*f*) may also be usable.

Figure 2:
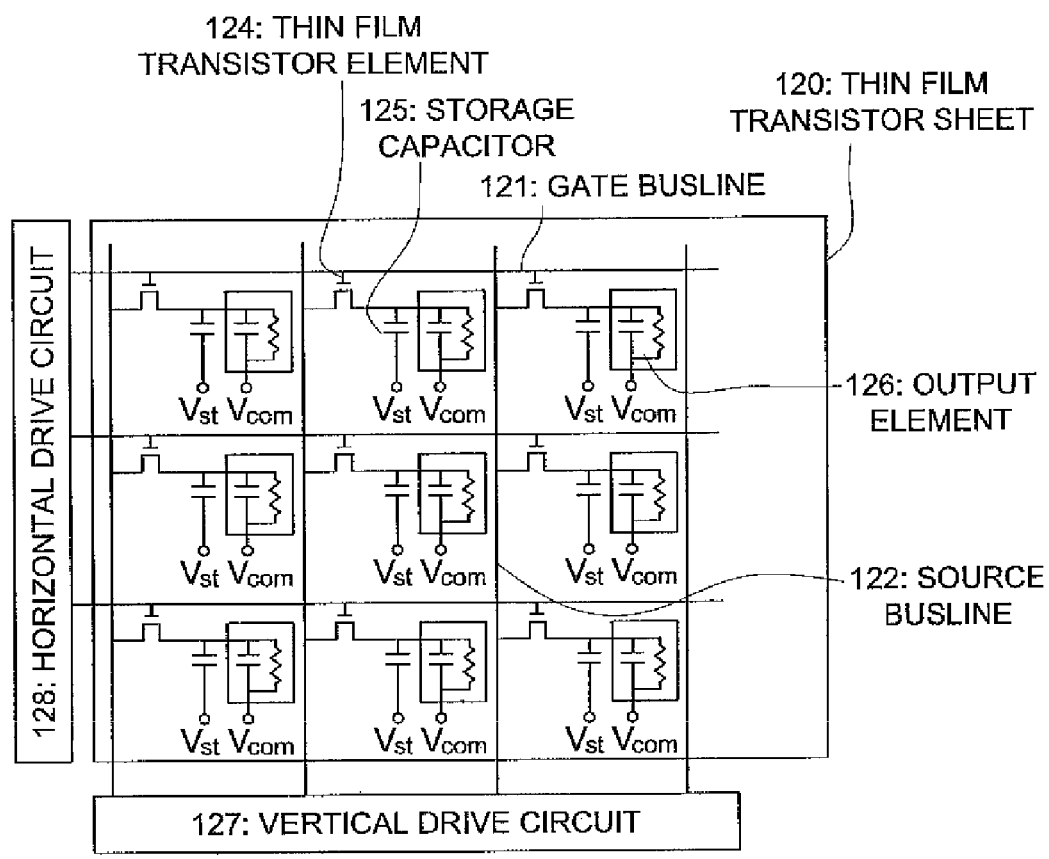
FIG. 2 is a schematic equivalent circuit of an example of a thin film transistor sheet in which a plurality of thin film transistor elements are arrayed.

FIG. 2 shows an example of a schematic equivalent circuit of a thin film transistor sheet which is an electronic device in which a plurality of thin film transistor elements are arranged.

The thin film transistor sheet 120 incorporates a number of matrix-arranged thin film transistor elements 124. The symbol 121 represents a gate busline for the gate electrode of each thin film transistor element 124, and the symbol 122 represents a source busline for the source electrode of each thin film transistor element 124. The drain electrode of each organic thin film transistor element 124 is connected with an output element 126, being, for example, a liquid crystal or an electrophoretic element, which constitutes a pixel of a display device. In the illustrated example, an equivalent circuit constituted of a resistor and a capacitor shows a liquid crystal used as the output element 126. The symbols 125, 127, and 128 represent an accumulation capacitor, a vertical drive circuit, and a horizontal drive circuit, respectively. The present invention can be applied to form the source and drain electrodes, gate electrode, and further, gate busline, source busline and interconnection of the circuit, of each transistor element of thin film transistor sheet 120.

Subsequently, each member composing a TFT element will be explained.

(Electrode)

As an electroconductive material used for, for example, a source electrode, drain electrode or gate electrode, constituting a TFT element, any material is usable as far as having a practically acceptable conductivity as an electrode, and thus it is not specifically limited. Examples of such an electrode material include: platinum, gold, silver, nickel, chromium, copper, iron, tin, antimonial lead, tantalum, indium, palladium, tellurium, rhenium, iridium, aluminum, ruthenium, germanium, molybdenum, tungsten, tin-antimony oxide, indium-tin oxide (ITO), fluorine doped zinc, zinc, carbon, graphite, glassy carbon, silver paste, carbon paste, lithium, beryllium, sodium, magnesium, potassium, calcium, scandium, titanium, manganese, zirconium, gallium, niobium, sodium, sodium-potassium alloy, magnesium, lithium, aluminum/magnesium/copper mixture, magnesium/silver mixture, magnesium/aluminum mixture, magnesium/indium mixture, aluminum/aluminum oxide mixture and lithium/aluminum mixture.

As a conductive material, a conductive polymer and a metal particle may be preferably used. As a dispersed material containing metal particles, a well-known conductive paste may be used, however, preferable is a dispersed material containing metal particles having a diameter of 1 nm-50 nm and preferably 1 nm-10 nm. In order to form an electrode from metal particles, the abovementioned method can be similarly used and the abovementioned metals can be used as a material of metal particles.

(Formation Methods Such as Electrode)

Examples of a forming method of these electrodes include: a method to form an electrode by patterning a conductive thin film formed via vacuum evaporation or sputtering using the abovementioned materials by means of well-known photolithography or a lift-off method; and a method to form a resist pattern, first, via a thermal transfer method or an inkjet method on a metal foil of such as aluminum or copper and then to conduct etching. Also, patterning may be carried out by an inkjet method to directly eject a solution or a dispersion of a conductive polymer or a dispersion of, for example, metal particles; or by an abrasion method or photolithography using a film formed by a coating method. Further, applicable is a method of patterning by a printing method such as letterpress, intaglio printing, planographic printing and screen printing using an ink containing a conductive polymer or metal particles.

As methods of forming electrodes such as a source, drain or gate electrode, and a gate or source busline, there are known methods via an electroless plating method as a forming method without patterning a metal thin film using a photosensitive resin via etching or lift-off.

In forming methods of electrodes via the electroless plating method, as described in JP-A No. 2004-158805, a liquid containing a plating catalyst inducing electroless plating by acting on a plating agent is patterned, for example, via a printing method (including an ink-jet method), followed by allowing the plating agent to be brought into contact with a portion where an electrode is provided. Thus, electroless plating is carried out on the above portion via contact of the catalyst with the plating agent to form an electrode pattern.

The catalyst and the plating agent may reversely be employed in such electroless plating, and also pattern formation may be conducted using either thereof. However, it is preferable to employ a method of forming a plating catalyst pattern and then applying a plating agent thereto.

As a printing method, for example, screen printing, planographic printing, letterpress, intaglio printing or inkjet printing is used.

(Gate Insulating Layer)

Various insulating films may be employed as a gate insulating layer of the present invention. Of these, an inorganic oxide film having a relative high dielectric constant is specifically preferred. Examples of an inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bisthmus titanate, strontium bismuth tantalate, bismuth tantalate niobate, and yttrium trioxide. Of these, preferred are silicon oxide, aluminum oxide, tantalum oxide, and titanium oxide. Inorganic nitrides such as silicon nitride or aluminum nitride may also be preferably employed.

Methods to form the above film include dry processes such as a vacuum deposition method, a molecular beam epitaxial deposition method, an ion cluster beam method, a low energy ion beam method, an ion plating method, a CVD method, a sputtering method, or an atmospheric pressure plasma method, as well as wet processes such as methods employing coating such as a spray coating method, a spin coating method, a blade coating method, a dip coating method, a casting method, or a roller coating method, a bar coating method, or a die coating method, and methods employing patterning such as printing or ink-jet printing. It is possible to employ any of these method depending materials.

In the wet processes, employed may be a method in which a liquid coating composition, which is prepared by dispersing minute inorganic oxide particles into any appropriate organic solvent or water employing, if necessary, dispersing aids such as surface active agents, is coated and subsequently dried, or a so-called sol-gel method in which a solution of oxide precursors such as alkoxides is coated and subsequently dried.

Of these, preferred is the atmospheric pressure plasma method described above.

It is also preferable that the gate insulating film is composed of either an anodized film or the above anodized film and an insulating film. It is preferable that the anodized film undergoes a sealing treatment. The anodized film is formed in such a manner that anodizable metals undergo anodic oxidation via methods known in the art.

Listed as an anodizable metal may be aluminum or tantalum. Anodic treatment methods are not particularly limited, and methods known in the art are usable.

Further employed as the organic compound film may be polyimide polyamide, polyester, polyacrylate, photo-radical polymerization based or photo-cationic polymerization based photocuring resins, or copolymers incorporating acrylonitrile components, polyvinyl phenol, polyvinyl alcohol, and novolak resins.

An inorganic oxide film and an organic oxide film may be simultaneously employed via superimposition. Further, the thickness of the above insulating film is commonly 50 nm-3 μm, but is preferably 100 nm-1 μm.

(Substrate)

Various materials are usable as support materials to constitute a substrate. For example, employed may be: ceramic substrates such as glass, quartz, aluminum oxide, sapphire, silicon nitride and silicon carbide; semiconductor substrates such as silicon, germanium, gallium arsine and gallium nitrogen; paper; and unwoven cloth. However, in the present invention, it is preferable that the substrate is composed of a resin, for example, plastic sheet film is usable. Examples of such plastic sheet film include those composed, for example, of polyethylene terephthalate (PET), polyethylene naphthalate (PEN), polyether sulfone (PES), polyether imide, polyether ether ketone, polyphenylene sulfide, polyarylate, polyimide, polycarbonate (PC), cellulose triacetate (TAC), and cellulose acetate propionate (CAP). By employing a plastic film, it is possible to decrease weight compared to when a glass substrate is employed. Further, it is possible to enhance portability and durability against impact.

Further, it is possible to arrange an element protective layer on the thin film transistor element of the present invention. The above inorganic oxides or inorganic nitrides are cited as materials of the protective layer. It is preferable to form the protective layer employing the above atmospheric pressure plasma method.

EXAMPLES

Example 1

In FIGS. 3(1)-3(4), schematic cross-sectional views illustrating the manufacturing process of a thin film transistor are shown.

(Manufacturing of Thin Film Transistor Element 1)

As substrate 6, an alkali-free glass substrate was used, and an ITO film having a thickness of 150 nm was formed all over the substrate by sputtering. Then, the ITO film was subjected to patterning via photolithography to form gate electrode 4.

Subsequently, gate insulating layer 5 composed of 200 nm thick silicon oxide was formed by an atmospheric pressure plasma CVD method. The atmospheric pressure plasma treatment apparatus disclosed in FIG. 6 of JP-A No. 2003-303520 was used.

| (Gases used) | |
|---|---|
| Inert gas: helium | 98.25% by volume |
| Reactive gas: oxygen gas | 1.5% by volume |
| Reactive gas: tetraethoxysilane vapor (bubbled with helium gas) | 0.25% by volume |

| (Discharge conditions) | |
|---|---|
| High frequency power source: | 13.56 MHz |
| Discharge power: | 10 W/cm² |

(Electrode Conditions)

The electrode is a grounded roll electrode having a dielectric material (specific dielectric constant: 10) with a smoothed surface at Rmax (surface roughness) of 5 μm, wherein a stainless steel jacket roll base material having a cooling device employing chilled water is coated with a 1 mm thickness of alumina via ceramic spraying, followed by being coated with a solution prepared by diluting tetramethoxysilane with ethyl acetate and dried, and then by being sealed via ultraviolet irradiation. In contrast, to prepare an application electrode, a hollow square-shape stainless steel pipe was coated with the above dielectric material under the same condition as above.

Thus, gate electrode 4 and gate insulating layer 5 were formed on the glass substrate, namely, substrate 6 (FIG. 3(1)).

Subsequently, a semiconductor layer was formed.

(Formation of Semiconductor Precursor Thin Film)

An inkjet coating was carried out at the channel formation section by using an ink prepared by mixing indium nitrate, zinc nitrate and gallium nitrate in a metal ratio of 1:1:1 (molar ratio) to form a 10% by mass of aqueous solution. The coated film was dried at 1.50° C. for 10 minutes to form semiconductor precursor thin film 1' (FIG. 3(2)).

Then, the substrate was subjected to a heat treatment at 350° C. for 1 hour in air to carry out thermal oxidation, whereby the thin film of the precursor of the metal oxide semiconductor turned transparent and was transformed to a metal oxide thin film. Thus, semiconductor layer 1 was formed (thickness: 50 nm) (FIG. 3(3)).

Next, by vacuum evaporating gold through a mask, source electrode 2 and drain electrode 3 were formed, and thus thin film transistor element was manufactured (FIG. 3(4)). The dimensions of each of the electrodes were as follows: 10 μm in width, 50 μm in length (channel width) and 50 nm in thickness. The distance between the source electrode and the drain electrode (channel length) was 15 μm.

Thus, thin film transistor element 1 was obtained.

Subsequently, thin film transistor elements 2-7 were manufactured in the same manner as above except that the semiconductor layer was, formed by varying the metal salt, namely, the precursor (or by varying the solvent).

(Thin Film Transistor Element 2)

Thin film transistor element 2 was manufactured in the same manner as in Thin film transistor element 1 except that indium sulfate, zinc sulfate and gallium sulfate were used instead of the indium nitrate, zinc nitrate and gallium nitrate. Namely, the indium sulfate, zinc sulfate and gallium sulfate were mixed in a metal ratio of 1:1:1 (molar ratio), followed by dissolving the mixture to form a 10% by mass of aqueous solution to be used as an ink. In the same manner as above, the obtained thin film was heat treated at 350° C. for 1 hour (calcination), and then a source electrode and a drain electrode were formed similarly as above.

(Thin Film Transistor Element 3)

Thin film transistor element 3 was manufactured in the same manner as in Thin film transistor element 1 except that, instead of the indium nitrate, zinc nitrate and gallium nitrate, respectively the same number of moles of phosphates ($PO_4$ salts) were used.

(Thin Film Transistor Element 4)

Thin film transistor element 4 was manufactured in the same manner as in Thin film transistor element 1 except that, instead of the indium nitrate, zinc nitrate and gallium nitrate, respectively the same number of moles of carbonates ($CO_3$ salts) were used.

(Thin Film Transistor Element 5)

Thin film transistor element 5 was manufactured in the same manner as in Thin film transistor element 1 except that, instead of the indium nitrate, zinc nitrate and gallium nitrate, respectively the same number of moles of acetates ($CH_3CO_2$ salts) were used.

(Thin Film Transistor Element 6)

Thin film transistor element 5 was manufactured in the same manner as in Thin film transistor element 1 except that, instead of the indium nitrate, zinc nitrate and gallium nitrate, respectively the same number of moles of oxalates were used.

(Thin Film Transistor Element 7)

Thin film transistor element 7 was manufactured in the same manner as in Thin film transistor element 1 except that the indium nitrate, zinc nitrate and gallium nitrate were replaced with respective chlorides and the aqueous solution was varied to an acetonitrile solution. Namely, the indium chloride, zinc chloride and gallium chloride were mixed in a metal ratio of 1:1:1 (molar ratio), followed by dissolving the mixture to form a solution having the same molar concentration to form the precursor layer by coating.

(Thin Film Transistor Element 8)

Thin film transistor element 8 was manufactured in the same manner as in Thin film transistor element 7 except that the solution was changed to an aqueous solution to form the precursor layer by coating.

(Thin Film Transistor Elements 9-15)

Thin film transistor elements 9-14 each were manufactured in the same manner as in Thin film transistor element 1 except that the aqueous solution of the indium nitrate, zinc nitrate and gallium nitrate was varied to the solution using the solvent listed in Table 1 to form the precursor layer by coating.

(Thin Film Transistor Element 16)

Thin film transistor element 16 was manufactured in the same manner as in Thin film transistor element 1 except that the aqueous solution of the indium nitrate, zinc nitrate and gallium nitrate was replaced with a solution of water/ethanol=9/1 (in mass ratio) as described in Table 1; microwave irradiation was carried out at a power of 500 W using a microwave (28 GHz) irradiator employing a gyrotron oscillator in an ambient atmosphere under an atmospheric pressure, instead of heat treating at 350° C. for 1 hour (thermal oxidation); and the microwave irradiation was carried out so that, after elevating the surface temperature of the thin film to 300° C. at an output power of 500 W, the surface temperature was kept at 300° C. to form semiconductor 1 by PID controlling the output power of the microwave using a surface thermometer employing a thermocouple while keep warming only the semiconductor side of the substrate using a heat insulating material.

Each of the thin film transistors produced by the above methods showed n-type enhancement mode. An increase in the drain current was observed (transfer characteristics), when the gate bias was swept from −10 V to +20 V while setting the drain bias to 10 V. The mobility ($cm^2/Vs$) was estimated from the saturation region, and further the on/off ratio (in log value) and threshold value (Vth) were estimated. The threshold value Vth was estimated as the value of the gate bias obtained by extrapolating the value of $\sqrt{Id}$ to $\sqrt{Id}=0$ in the relationship between the gate bias and the square root of the drain current.

Also, the solubility and the stability of the solution when each metal salt solution was prepared were evaluated.

Solubility: the solubility was visually evaluated according to the following criteria at times of mixing-stirring and ultrasonic dissolution.

A: The salts were thoroughly dissolved with a short time stirring of 30 minutes or less.

B: The salts were almost dissolved by only stirring and thoroughly dissolved with ultrasonic dissolution of 30 minutes or less.

C: The salts were not fully dissolved with the stirring of 30 minutes or more, but thoroughly dissolved with ultrasonic dissolution of 30 minutes or more.

D: Insoluble substance is observed after stirring and ultrasonic dissolution of 30 minutes or more.

Solution stability: after dissolution, the solution was kept standing for 1 week at an ambient temperature and the existence of deposits were observed.

A: No deposit was observed.

B: No deposit was observed until the 5th day, but slight deposit was observed after the 5th day.

C: No deposit was observed until the 2nd day, but deposit was observed after the 2nd day.

D: Deposit was observed within 2 days.

Ejecting stability while inkjet coating of the solution was also evaluated.

A: No problem was observed.

B: Slight unevenness was observed in all the areas or unevenness occurred after the 4th ejection.

C: A number of defects and notable unevenness were observed or almost no ejection was observed.

TABLE 1

| TFT Element | Metal Salt | Solvent | Solubility | Solution Stability | IJ Ejection Property | Carrier Mobility ($cm^2/Vs$) | On/off Ratio | Vth | Remarks |
|---|---|---|---|---|---|---|---|---|---|
| 1 | $NO_3$ salt | water | A | A | B | 3.0 | 7.0 | 2.5 | Inventive |
| 2 | $SO_4$ salt | water | A | A | B | 0.5 | 4.0 | 7.0 | Inventive |
| 3 | $PO_4$ salt | water | A | A | B | 0.1 | 3.8 | 4.5 | Inventive |
| 4 | $CO_3$ salt | Water | A | A | B | 1.0 | 6.2 | 3.5 | Inventive |
| 5 | acetate | water | A | A | B | 0.9 | 6.1 | 6.5 | Inventive |
| 6 | oxalate | water | A | A | B | 0.5 | 5.1 | 7.5 | Inventive |
| 7 | Cl salt | AN | A | A | A | 0.01 | 3.2 | 12.0 | Comparative |
| 8 | Cl salt | water | D | D | B | — | — | — | Comparative |
| 9 | $NO_3$ salt | methanol | C | C | A | 0.5 | 4.5 | 8.3 | Inventive |
| 10 | $NO_3$ salt | ethanol | C | C | A | 0.7 | 4.8 | 5.7 | Inventive |
| 11 | $NO_3$ salt | **3/7 | B | C | A | 1.5 | 6.0 | 4.3 | Inventive |
| 12 | $NO_3$ salt | **5/5 | A | B | A | 2.2 | 6.3 | 2.5 | Inventive |
| 13 | $NO_3$ salt | **7/3 | A | A | A | 3.0 | 7.1 | 2.3 | Inventive |
| 14 | $NO_3$ salt | **9/1 | A | A | A | 4.0 | 7.6 | 1.5 | Inventive |
| 15 | $NO_3$ salt | **95/5 | A | A | B-A | 3.3 | 7.3 | 1.2 | Inventive |
| 16 | $NO_3$ salt | **9/1 | A | A | A | 4.5 | 7.8 | 0.5 | Inventive |

**water/ethanol =

As shown in Table 1, when the metal salts of the present invention used as aqueous solutions were compared with the acetonitrile solution of chlorides (Cl salts) as comparative samples, higher mobilities, higher on/off ratios and higher threshold values were observed for the metal salts of the present invention. Specifically, when the nitrates were used, the mobilities, on/off ratios and threshold values were higher among the samples of the present invention.

Example 2

Similarly, a bottom gate-top contact thin film transistor element of which schematic cross-sections were shown in FIGS. 4(1)-4(5) were manufactured.

A polyimide film (200 μm in thickness) was used as substrate 6. Corona discharge treatment was carried out at a condition of 50 W/m²/min on the substrate, followed by forming a subbing layer as follows to improve the adhesion.

(Formation of Subbing Layer)

The coating liquid having the following composition was applied so that the dry thickness was 2 μm, followed by drying at 90° C. for 5 minutes, and then was subjected to hardening using a high-pressure mercury lamp of 60 W/cm at a distance of 10 cm for 4 seconds.

| | |
|---|---|
| Dipentaerythritol hexaacrylate monomer | 60 g |
| Dipentaerythritol hexaacrylate dimer | 20 g |
| Component of dipentaerythritol hexaacrylate trimer or larger | 20 g |
| Diethoxybenzophenone UV initiator | 2 g |
| Silicone surfactant | 1 g |
| Methylethyl ketone | 75 g |
| Methylpropyleneglycol | 75 g |

Further, atmospheric pressure plasma treatment was continuously carried out by the following condition to form a silicon oxide layer having a thickness of 50 nm, and these layers were used as subbing layer 8 (FIG. 4(1)).

| (Gases used) | |
|---|---|
| Inert gas: helium | 98.25% by volume |
| Reactive gas: oxygen gas | 1.5% by volume |
| Reactive gas: tetraethoxysilane vapor (bubbled with helium gas) | 0.25% by volume |

| (Discharge conditions) | |
|---|---|
| High frequency power source: | 13.56 MHz |
| Discharge power: | 10 W/cm² |

(Electrode Conditions)

The electrode is a grounded roll electrode having a dielectric material (specific dielectric constant: 10) with a smoothed surface at a 5 μm Rmax, wherein a stainless steel jacket roll base material having a cooling device employing chilled water is coated with a 1 mm thickness of alumina via ceramic spraying, followed by being coated with a solution prepared by diluting tetramethoxysilane with ethyl acetate and dried, and then by being sealed via ultraviolet irradiation. In contrast, to prepare an application electrode, a hollow square-shape stainless steel pipe was coated with the above dielectric material under the same condition as above.

Subsequently, a gate electrode was formed. After forming an ITO film having a thickness of 150 nm by sputtering all over the substrate, the ITO film was etched via photolithography to form gate electrode 4 (FIG. 4(2)).

(Gate Insulating Layer Forming Process)

After gate electrode 4 was formed, gate insulating layer 5 having a thickness of 150 nm was formed using the above-mentioned atmospheric plasma method at the film temperature of 200° C. (FIG. 4(3)).

Next, a semiconductor layer was formed.

(Formation of Semiconductor Precursor Thin Film)

An inkjet coating was carried out at the channel formation section by using an ink prepared by mixing indium nitrate, zinc nitrate and gallium nitrate in a metal ratio of 1:1:1 (molar ratio), followed by dissolving the mixture to form a 10% by mass of aqueous solution, while keeping the substrate temperature at 100° C. The coated film was dried at 150° C. for 10 minutes to form semiconductor precursor thin film 1' (FIG. 4(4)).

Then, on this substrate, microwave irradiation was carried out at a power of 500 W using a multi-mode type 2.45 GHz microwave irradiator (μ-reactor, produced by Shikoku Instrumentation CO., LTD.) in an ambient atmosphere under an atmospheric pressure. The microwave irradiation was carried out so that, after elevating the surface temperature of the thin film to 300° C. at an output power of 500 W, the surface temperature of the thin film was kept at 300° C. for 30 minutes by PID controlling the output power of the microwave using a surface thermometer employing a thermocouple while keep warming only the semiconductor side of the substrate using a heat insulating material, whereby semiconductor precursor material thin film 1' was transformed to semiconductor layer 1.

Subsequently, in the same manner as in Example 1, a source electrode and a drain electrode were formed via gold vacuum evaporation of gold to manufacture thin film transistor element 17 (FIG. 4(5)).

Similar to Example 1, Thin film transistor elements 18-22 were manufactured in the same manner as in Thin film transistor element 17 except that the nitrates used to form the semiconductor precursor thin film were replaced with, respectively, sulfates, phosphates, carbonates, acetates and oxalates each in the same number of moles.

Comparative Thin film transistor element 23 was manufactured in the same manner except that, instead of the indium nitrate, zinc nitrate and gallium nitrate, indium chloride, zinc chloride and gallium chloride each in the same number of moles of the above respective nitrates were used and the aqueous solution was varied to an acetonitrile solution.

The dimensions of each of the source electrode and the drain electrode were as follows: 10 μm in width, 50 μm in length (channel width) and 50 nm in thickness. The distance between the source electrode and the drain electrode (channel length) was 15 μm.

In the same manner as in Example 1, the properties of each thin film transistor element were estimated by sweeping the gate bias from −10 V to +20 V while setting the drain bias to 10 V to observe the increase in the drain current (transfer characteristics), and from the saturation region, the mobility (cm²/Vs), on/off ratio (in log value) and threshold value (Vth) were estimated.

The results were given below.

TABLE 2

| TFT Element | Metal Salt | Carrier Mobility (cm²/Vs) | On/off Ratio | Vth | Remarks |
|---|---|---|---|---|---|
| 17 | NO₃ salt | 2.0 | 6.8 | 3.0 | Inventive |
| 18 | SO₄ salt | 0.3 | 4.0 | 6.2 | Inventive |
| 19 | PO₄ salt | 0.1 | 4.0 | 6.5 | Inventive |
| 20 | CO₃ salt | 1.0 | 6.0 | 5.5 | Inventive |
| 21 | acetate | 0.8 | 6.0 | 5.6 | Inventive |
| 22 | oxalate | 0.5 | 5.0 | 7.8 | Inventive |
| 23 | Cl salt | 0.05 | 2.5 | 15.3 | Comparative |

Similar to Example 1, when the thin film transistor elements manufactured according to the method of the present invention were compared with the thin film transistor element using the chlorides (Cl salts) as comparative samples, higher mobilities, higher on/off ratios and lower threshold values were observed for the thin film transistor elements of the present invention. Specifically, when the nitrates were used, the thin film transistor element exhibited more excellent properties with respect to the mobility, on/off ratio and threshold value among the samples of the present invention.

Example 3

Figure 5:
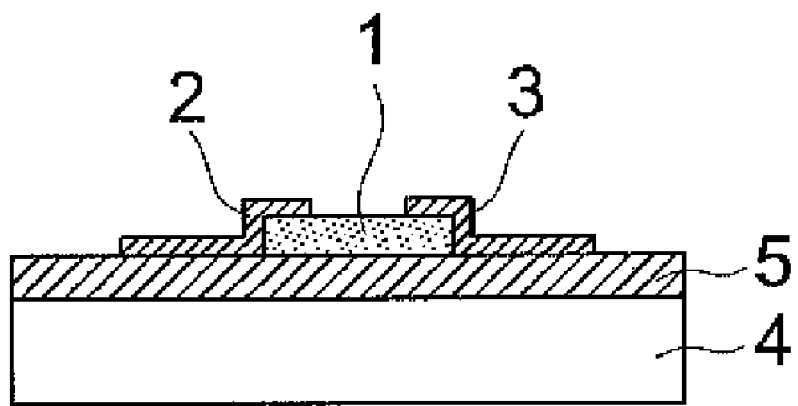
FIG. 5 is a drawing illustrating the constitution of a thin film transistor of Example 3.

Thin film transistor elements having different compositions were manufactured by varying the ratio of indium nitrate [In(NO₃)₃], zinc nitrate [Zn(NO₃)₂] and gallium nitrate [Ga(NO₃)₃] as raw materials of the semiconductor precursor (FIG. 5).

On a silicon wafer having a specific resistance of 0.02 Ω/cm as gate electrode 4, a 2000 Å thick of thermal oxidation film was formed to obtain gate insulating layer 5.

Hereafter, this is called as a substrate. The substrate was then cleaned by being irradiated with a UV light for 10 minutes at 70° C. under a circumstance of ozone.

Next, a metal salt coating solution was prepared as a precursor material.

The nitrates of In, Ga, and Zn were mixed and dissolved in pure water so that the concentration of the sum of the nitrates was 10% by mass. The mixture was dispersed for 10 minutes using ultrasound.

Subsequently, the product was passed through a filter having a mesh diameter of 0.2 μm and treated by ultrasound for 10 minutes for defoaming. Then, the liquid was further treated by ultrasound for 5 minutes under a reduced pressure.

While keeping the substrate temperature at 100° C., the prepared coating liquid was ejected onto the channel formation section of the semiconductor layer by the piezo type inkjet apparatus to form a precursor material thin film.

The substrate was dried by keeping the substrate temperature at 100° C., and then further dried by increasing the temperature up to 150° C.

The Si substrate was irradiated with a microwave from the substrate side to indirectly calcinate (300° C.) the precursor material thin film by heat from the Si substrate, whereby transformed to semiconductor layer 1 (50 nm in thickness).

Microwave irradiation was carried out at a power of 500 W using a multi-mode type 2.45 Hz microwave irradiator (μ-reactor, produced by Shikoku Instrumentation CO., LTD.) in an ambient atmosphere under an atmospheric pressure, from the substrate side to calcinate, whereby precursor material thin film 1' was transformed to semiconductor layer 1. The microwave irradiation was carried out so that, after elevating the surface temperature of the thin film to 300° C. at an output power of 500 W, the surface temperature was kept at 300° C. for 30 minutes by PID controlling the output power of the microwave using a surface thermometer employing a thermocouple while keep warming only the semiconductor side of the substrate using a heat insulating material.

Subsequently, a source electrode and a drain electrode were formed by vacuum evaporating gold via a mask, whereby a thin film transistor element was manufactured.

The dimensions of each of the source electrode and the drain electrode were as follows: 100 μm in width, 100 nm in thickness, channel width W=3 mm and channel length L=20 μm. In FIG. 5, a cross-sectional configuration diagram of thus manufactured thin film transistor was shown.

The metal salt coating solutions which were the precursor materials were prepared by varying the ratio of the nitrates of In, Ca and Zn as listed in Table 3. The molar ratio of each metal was determined when the materials were charged and after the oxide semiconductor was formed by calcination. The composition of the semiconductor thin film after formed was determined by detecting the metal ratio by ESCA and by calculating the average value while excluding the data from the topmost surface and from the very vicinity of the interface with the insulating layer.

For each of Thin film transistor elements 24-34; in the similar manner as in Example 1, the properties of the thin film transistor element were estimated by sweeping the gate voltage from −40 V to +40 V, while setting the voltage between the source and drain electrodes to 40 V to obtain the mobility (μ) (cm²/Vs), on/off ratio and threshold value (Vth).

TABLE 3

| | In:Ga:Zn Ratio | | | | |
|---|---|---|---|---|---|
| TFT Element | Charged Ratio | Ratio of After Calcination | Carrier Mobility (cm²/Vs) | On/off Ratio | Vth |
| 24 | 1:0.1:1 | 1:0.2:0.9 | 2 | 3.3 | −15.0 |
| 25 | 1:0.2:1 | 1:0.4:0.9 | 2.5 | 5.0 | −8.0 |
| 26 | 1:0.5:1 | 1:1.1:0.9 | 4.5 | 7.5 | 2.0 |
| 27 | 1:1:1 | 1:2:1 | 3.0 | 7.0 | 2.4 |
| 28 | 1:1.5:1 | 1:2.3:1 | 1.5 | 6.7 | 2.0 |
| 29 | 1:0.5:2 | 1:1:1.8 | 4 | 6.1 | −1.0 |
| 30 | 1:0.5:4 | 1:0.9:3.5 | 5.7 | 5.0 | −2.0 |
| 31 | 1:0.5:5 | 1:0.9:4.5 | 5.7 | 3.5 | −5.5 |
| 32 | 1:0.5:5.5 | 1:0.9:4.8 | 5 | 2.8 | −7.0 |
| 33 | 1:0.5:0.7 | 1:1:0.5 | 5 | 6.8 | 1.5 |
| 34 | 1:0.5:0 | 1:1:0 | 6 | 7.5 | 1.2 |

As shown in Table 3, all the TFT elements of which coating solution has the metal ratio which meets the range of claim 6 showed sufficient and excellent properties.

Example 4

In FIGS. 3(1) 3(4), schematic cross-sectional views illustrating a manufacturing process of a thin film transistor were shown.

(Manufacturing of Thin Film Transistor Element 35)

As substrate 6, a quartz substrate having a thickness of 0.5 mm was used, and an ITO film having a thickness of 150 nm was formed all over the substrate by sputtering. Then, the ITO film was subjected to patterning via photolithography to form gate electrode 4.

Subsequently, gate insulating layer 5 composed of 200 nm thick silicon oxide was formed by an atmospheric pressure plasma CVD method. The atmospheric pressure plasma treatment apparatus disclosed in FIG. 6 of JP-A No. 2003-303520 was used.

| (Gases used) | |
|---|---|
| Inert gas: helium | 98.25% by volume |
| Reactive gas: oxygen gas | 1.5% by volume |
| Reactive gas: tetraethoxysilane vapor (bubbled with helium gas) | 0.25% by volume |

| (Discharge conditions) | |
|---|---|
| High frequency power source: | 13.56 MHz |
| Discharge power: | 10 W/cm$^2$ |

(Electrode Conditions)

The electrode is a grounded roll electrode having a dielectric material (specific dielectric constant: 10) with a smoothed surface at Rmax (surface roughness) of 5 μm, wherein a stainless steel jacket roll base material having a cooling device employing chilled water is coated with a 1 mm thickness of alumina via ceramic spraying, followed by being coated with a solution prepared by diluting tetramethoxysilane with ethyl acetate and dried, and then by being sealed via ultraviolet irradiation. In contrast, to prepare an application electrode, a hollow square-shape stainless steel pipe was coated with the above dielectric material under the same condition as above.

Thus, gate electrode 4 and gate insulating layer 5 were formed on the glass substrate, namely, substrate 6 (FIG. 3(1)).

Subsequently, a semiconductor layer was formed.

(Formation of Semiconductor Precursor Thin Film)

An inkjet coating was carried out at the channel formation section by using an ink prepared by mixing indium nitrate and gallium nitrate in a metal ratio of 1:0.5 (molar ratio) to form a 10% by mass of aqueous solution. The coated film was dried at 150° C. for 10 minutes to form semiconductor precursor thin film 1' (FIG. 3(2)).

Then, on this substrate, microwave irradiation (2.45 GHz) was carried out at a power of 500 W using a multi-mode type 2.45 GHz microwave irradiator (μ-reactor, produced by Shikoku Instrumentation CO., LTD.) in an ambient atmosphere under an atmospheric pressure. The microwave irradiation was carried out so that, after elevating the surface temperature of the thin film to 600° C. at an output power of 500 W, the surface temperature of the thin film was kept at 600° C. for 20 minutes by PID controlling the output power of the microwave using a surface thermometer employing a thermocouple while keep warming only the semiconductor side of the substrate using a heat insulating material, whereby semiconductor precursor material thin film 1' was transformed to semiconductor layer 1 (FIG. 3(3)).

Subsequently, in the same manner as in Example 1, a source electrode and a drain electrode were formed via vacuum evaporation of gold to manufacture thin film transistor element 35 (FIGS. 3(4)).

Similar to Example 3, Thin film transistor elements 36-39 were manufactured in the same manner as in Thin film transistor element 35 except that the calcination temperature was varied respectively to 400° C., 300° C., 200° C. and 150° C.

Thin film transistor element 40 and 41 were manufactured in the same manner except for heating at 600° C. and 300° C., respectively, using an electric furnace, instead of using microwave irradiation.

The dimensions of each of the source electrode and the drain electrode were as follows: 10 μm in width, 50 μm in length (channel width) and 50 nm in thickness. The distance between the source electrode and the drain electrode (channel length) was 15 μm.

In the same manner as in Example 1, the properties of each thin film transistor element were estimated by sweeping the gate bias from −10 V to +20 V while setting the drain bias to 10 V to observe the increase in the drain current (transfer characteristics), and from the saturation region, the mobility (cm$^2$/Vs), on/off ratio and threshold value were estimated. Further, X-ray diffraction was carried out on the semiconductor thin film of each element to examine the occurrence of a peak. In Thin film transistor elements 35 and 40, a diffraction peak was observed at 2θ=31°, however, no peak was observed in other Thin film transistor elements, which means that the thin film is amorphous.

The results will be shown below.

TABLE 4

| TFT Element | Calcination | Temperature (° C.) | XRD peak | Carrier Mobility (cm$^2$/Vs) | On/off Ratio | Vth |
|---|---|---|---|---|---|---|
| 35 | Microwave | 600 | observed | 0.5 | 5.2 | −20 |
| 36 | Microwave | 400 | none | 3.2 | 5.3 | −15 |
| 37 | Microwave | 300 | none | 3.0 | 6.5 | −5 |
| 38 | Microwave | 200 | none | 4.3 | 7.5 | 2.5 |
| 39 | Microwave | 150 | none | 1.3 | 7.1 | 2.6 |
| 40 | Electric Furnace | 600 | observed | 0.5 | 6.1 | −20 |
| 41 | Electric Furnace | 300 | none | 1.5 | 5.8 | −8 |

Comparative Example

In Example 4, Thin film transistor element 42 was manufactured in the same manner except that semiconductor thin film was formed via sputtering. The semiconductor thin film was formed via magnetron sputtering using an oxide target having an indium:gallium ratio of 1:1, and the composition of the thin film was examined by ESCA. The obtained ratio of indium to gallium was almost 1. According to the manufacturing condition of Thin film transistor 42, variations in the properties of the elements were large, and the measured values varied in the ranges of 0.02-1.0 cm$^2$/Vs for mobility's, 4-7 for on/off ratios and −20 V-+20 V for threshold values. When the thin film transistor element was heated at 300° C. for 20 minutes in air in an electric furnace, the properties were stabilized, and the mobility was cm$^2$/Vs, the on/off ratio was 5 digits and the threshold value was 15 V.

What is claimed is:

1. A method of manufacturing a metal oxide semiconductor comprising the step of:
    conducting a transformation treatment on a semiconductor precursor layer containing a metal salt to form the metal oxide semiconductor,
    wherein
    the metal salt is a nitrate; and
    the semiconductor precursor layer is formed by coating a solution of the metal salt.

2. The method of claim 1, wherein the solution of the metal salt is an aqueous solution.

3. The method of claim 1, wherein the metal salt comprises at least one selected from the group consisting of metal salts of In, Zn and Sn.

4. The method of claim 1, wherein the metal salt comprises at least one selected from the group consisting of metal salts of Ga and Al.

5. The method of claim 1,
wherein
the solution of the metal salt comprises a metal salt of Metal A, a metal salt of Metal B and a metal salt of Metal C in a molar ratio of Metal A, Metal B and Metal C represented by the following formula:

Metal A:Metal B:Metal C=1:0.2-1.5:0-5, wherein
Metal A denotes a metal contained in a metal salt selected from the group consisting of metal salts of In and Sn;
Metal B denotes a metal contained in a metal salt selected from the group consisting of metal salts of Ga and Al; and
Metal C denotes a metal contained in a metal salt of Zn.

6. The method of claim 1, wherein the transformation treatment is a heat treatment at a temperature of 100° C. to 400° C.

7. The method of claim 1, wherein the transformation treatment comprises microwave irradiation, wherein a frequency of the microwave is 0.3 GHz to 50 GHz.

8. A method of manufacturing a metal oxide semiconductor comprising the step of:
conducting a transformation treatment on a semiconductor precursor layer containing metal salts to form the metal oxide semiconductor,
wherein
the semiconductor precursor layer is formed by coating a solution of the metal salts;
the solution of metal salts comprises metal salts selected from the group consisting of a nitrate, a sulfate, a phosphate, a carbonate, an acetate and an oxalate of a metal; and
the solution of the metal salts comprises a metal salt of Metal A, a metal salt of Metal B and a metal salt of Metal C in a molar ratio of Metal A, Metal B and Metal C represented by the following formula:

Metal A:Metal B:Metal C=1:0.2-1.5:0-5, wherein
Metal A denotes a metal contained in a metal salt selected from the group consisting of metal salts of In and Sn;
Metal B denotes a metal contained in a metal salt selected from the group consisting of metal salts of Ga and Al; and
Metal C denotes a metal contained in a metal salt of Zn.

9. The method of claim 8, wherein the solution of the metal salts is an aqueous solution.

10. The method of claim 8, wherein the transformation treatment is a heat treatment at a temperature of 100° C. to 400° C.

11. The method of claim 8, wherein the transformation treatment comprises microwave irradiation, wherein a frequency of the microwave is 0.3 GHz to 50 GHz.

* * * * *